United States Patent
Huang

(10) Patent No.: US 10,749,127 B2
(45) Date of Patent: Aug. 18, 2020

(54) WHITE ORGANIC LIGHT-EMITTING DIODE DEVICE

(71) Applicant: Shenzhen China Star Optoelectronics Technology Co., Ltd., Shenzhen, Guangdong (CN)

(72) Inventor: Wei Huang, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 15/570,686

(22) PCT Filed: Jul. 26, 2017

(86) PCT No.: PCT/CN2017/094531
§ 371 (c)(1),
(2) Date: Oct. 30, 2017

(87) PCT Pub. No.: WO2019/006793
PCT Pub. Date: Jan. 10, 2019

(65) Prior Publication Data
US 2019/0051852 A1    Feb. 14, 2019

(30) Foreign Application Priority Data
Jul. 6, 2017  (CN) .......................... 2017 1 0546890

(51) Int. Cl.
*H01L 29/08* (2006.01)
*H01L 33/00* (2010.01)
(Continued)

(52) U.S. Cl.
CPC ...... *H01L 51/5036* (2013.01); *H01L 27/3211* (2013.01); *H01L 51/504* (2013.01);
(Continued)

(58) Field of Classification Search
CPC ............. H01L 27/3206; H01L 27/3211; H01L 51/5271; H01L 51/5221; H01L 51/5036;
(Continued)

(56) References Cited

U.S. PATENT DOCUMENTS 8,946,689 B2 * 2/2015 So ....................... H01L 51/0059
257/100
2007/0085086 A1 * 4/2007 Gohara ............... H01L 51/5203
257/79
(Continued)

FOREIGN PATENT DOCUMENTS

CN         1816228 A      8/2006
CN         1822730 A      8/2006
(Continued)

*Primary Examiner* — Alonzo Chambliss
(74) *Attorney, Agent, or Firm* — Nelson Mullins Riley & Scarborough LLP; Kongsik Kim, Esq.

(57) ABSTRACT

The present disclosure discloses a white OLED device, which includes a substrate, an anode, a hole injection layer, a hole transport layer, a light-emitting layer, an electron transport layer, and an electron injection layer that are disposed to be sequentially laminated; the white OLED device further includes a reflective layer disposed on the electron injection layer or a reflective layer interposed between the substrate and the anode, wherein a material of the reflective layer has a selective reflection function on light having different wavelengths. The white OLED device according to the present disclosure adjusts a spectrum of the device by utilizing the reflective layers of different materials, to optimize the luminous efficiencies of the respective light-emitting materials in the white OLED device during a light-emitting period, thereby overcoming the defect in the prior art that in order to match the light-emitting materials having low luminous efficiencies, actual luminous efficiencies of other light-emitting materials having higher specified luminous efficiencies are artificially reduced, which causes (Continued)

the light-emitting materials having the higher specified luminous efficiencies to generate more heat, so as to avoid problems of mismatching of concentration of carriers, high heat, accumulation of charges and heat and so on in the device.

7 Claims, 2 Drawing Sheets

(51) Int. Cl.
*H01L 31/0232* (2014.01)
*H01L 21/00* (2006.01)
*H01L 51/40* (2006.01)
*H01L 51/50* (2006.01)
*H01L 51/52* (2006.01)
*H01L 27/32* (2006.01)

(52) U.S. Cl.
CPC ...... *H01L 51/5056* (2013.01); *H01L 51/5072* (2013.01); *H01L 51/5092* (2013.01); *H01L 51/5206* (2013.01); *H01L 51/5221* (2013.01); *H01L 51/5271* (2013.01)

(58) Field of Classification Search
CPC ............. H01L 51/5056; H01L 51/5072; H01L 51/5092; H01L 51/50; H01L 51/52; H01L 51/504
See application file for complete search history.

(56) References Cited

U.S. PATENT DOCUMENTS

| | | | |
|---|---|---|---|
| 2010/0123150 A1* | 5/2010 | Anandan | H01L 27/3209 257/98 |
| 2011/0062427 A1* | 3/2011 | Jeong | H01L 51/5036 257/40 |
| 2012/0098011 A1* | 4/2012 | Choi | H01L 27/3209 257/98 |
| 2012/0305902 A1* | 12/2012 | So | H01L 51/0059 257/40 |
| 2014/0061601 A1* | 3/2014 | Kim | H01L 51/0052 257/40 |
| 2014/0159007 A1* | 6/2014 | Song | H01L 27/3213 257/40 |
| 2014/0159021 A1* | 6/2014 | Song | H01L 27/322 257/40 |
| 2014/0217366 A1 | 8/2014 | Chiu et al. | |
| 2015/0048335 A1* | 2/2015 | Chung | H01L 51/5206 257/40 |
| 2015/0076456 A1* | 3/2015 | Choi | H01L 27/3267 257/40 |
| 2015/0287947 A1* | 10/2015 | Yamamoto | H01L 51/504 257/40 |
| 2016/0164033 A1* | 6/2016 | Moon | H01L 51/5253 257/40 |
| 2016/0172423 A1* | 6/2016 | Nendai | H01L 27/3246 257/40 |

FOREIGN PATENT DOCUMENTS

| | | |
|---|---|---|
| CN | 1848478 A | 10/2006 |
| CN | 1922931 A | 2/2007 |
| CN | 101409330 A | 4/2009 |
| CN | 102687593 A | 9/2012 |
| CN | 102754236 A | 10/2012 |
| CN | 104272487 A | 1/2015 |
| CN | 105609661 A | 5/2016 |
| CN | 105826478 A | 8/2016 |
| JP | 2009231798 A | 10/2009 |

* cited by examiner

WHITE ORGANIC LIGHT-EMITTING DIODE DEVICE

CROSS-REFERENCES TO RELATED APPLICATIONS

This application is a U.S. national phase application, pursuant to 35 U.S.C. § 371, of PCT/CN2017/094531, filed Jul. 26, 2017, designating the United States, which claims priority to Chinese Application No. 201710546890.X, filed Jul. 6, 2017. The entire contents of the aforementioned patent applications are incorporated herein by this reference.

TECHNICAL FIELD

The present disclosure belongs to a technical field of organic light-emitting diode, and more particularly, to a white organic light-emitting diode (OLED) device.

BACKGROUND ART

At present, in the illumination and display field, OLEDs are increasingly and widely applied to industries of developing lighting products and panels because of characteristics of low start voltage, light weight and thinness, and self-illumination and so on of the OLEDs, to satisfy demands of low power consumption, light weight and thinness and area light source and so on.

Since luminous efficiencies of inner light-emitting materials of the OLED have greater differences, while manufacturing a device, it needs to adjust the luminous efficiencies of the materials of respective colors, in order to obtain ideal chromaticity parameters. For example, in a serial-type structure, in order to match a blue light with low luminous efficiency, it usually needs to reduce luminous efficiencies of a red light and a green light, so that the red and green light will generate more heat, thereby causing a problem of high heat of the device.

SUMMARY

In order to resolve the above problem existing in the prior art, the present disclosure provides a white OLED device. The white OLED device changes a frequency spectrum of an emitted spectrum by adjusting a material of its inner reflective layer, so as to achieve a purpose of adjusting parameters, such as a chromaticity coordinate and the like, of the light-emitting device.

In order to achieve the above purpose of the invention, the present disclosure adopts the following technical solution:
a white OLED device includes a substrate, an anode, a hole injection layer, a hole transport layer, a light-emitting layer, an electron transport layer, and an electron injection layer that are disposed to be sequentially laminated; the white OLED device further includes a reflective layer disposed on the electron injection layer or a reflective layer interposed between the substrate and the anode, wherein a material of the reflective layer has a selective reflection function on light having different wavelengths.

Further, the material of the reflective layer has the selective reflection function on light emitted by a material having a higher specified luminous efficiency in the light-emitting layer.

Further, the reflective layer is a single layer film or a composite film formed by any one or at least two of Al, Ag, $SiO_2$, $SiN_x$, $TiO_x$, $GaO_x$, and α-Si.

Further, a thickness of the reflective layer is 100 Å to 3000 Å.

Further, the white OLED device is a three-primary color white light device.

Further, the reflective layer is an Al film having a thickness of 1100 Å to 1300 Å.

Further, the white OLED device is a B-Y stacked white light device.

Further, the reflective layer is an $Al:TiO_2$ composite film having thicknesses of 1900 Å to 2100 Å and 400 Å to 600 Å, respectively.

Further, the white OLED device further includes a cathode interposed between the electron injection layer and the reflective layer.

The present disclosure adjusts the spectrum of the white OLED device by utilizing the reflective layers of different materials to optimize the luminous efficiencies of the respective light-emitting materials in the white OLED device during a light-emitting period, thereby overcoming the defect in the prior art that in order to match the light-emitting materials having low luminous efficiencies, actual luminous efficiencies of other light-emitting materials having higher specified luminous efficiencies are artificially reduced, which causes the light-emitting materials having the higher specified luminous efficiencies to generate more heat, so as to avoid problems of mismatching of concentration of carriers, high heat, accumulation of charges and heat and so on in the device.

BRIEF DESCRIPTION OF THE DRAWINGS

The above and other aspects, features and advantages of the embodiments of present disclosure will become more apparent from the following description, taken in conjunction with the accompanying drawings in which.

DETAILED DESCRIPTION OF EXEMPLARY EMBODIMENTS

Figure 1:
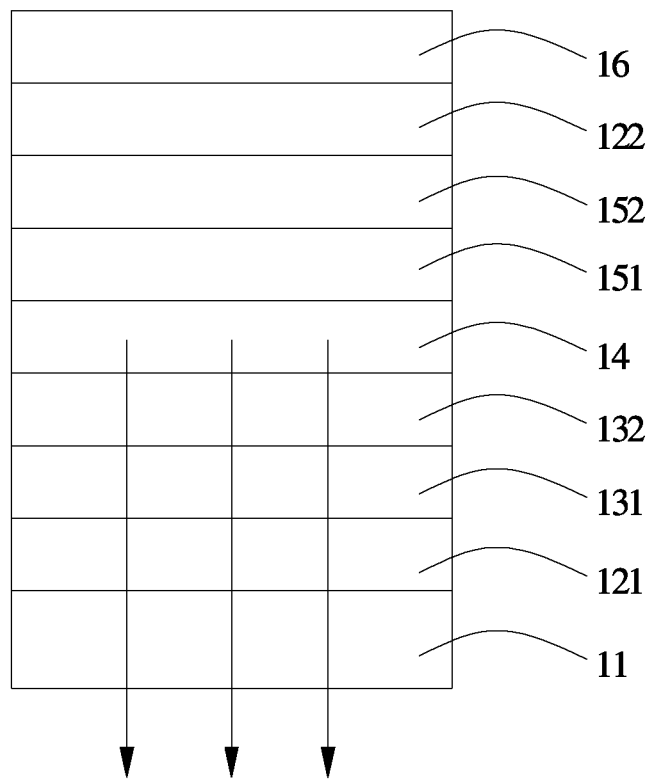
FIG. 1 is a structural schematic diagram of a bottom emitting white OLED device according to Embodiment 1 of the present disclosure.

Below, the embodiments of the present disclosure will be described in details with reference to the drawings. However, the present disclosure can be implemented in numerous different forms, and the present disclosure may not be explained to be limited to the specific embodiment set forth herein. Instead, these embodiments are provided to explain the principle and actual application of the present disclosure, thus other skilled in the art can understand various embodiments and amendments which are suitable for specific intended applications of the present disclosure. In the drawings, for clarity, shapes and sizes of the elements can be exaggerated, and the same reference numerals are used to represent the same or similar elements throughout.

Embodiment 1

The present embodiment provides a bottom light-emitting white OLED device. Referring to FIG. 1 for details, the white OLED device according to the present embodiment includes a substrate 11, an anode 121, a hole injection layer 131, a hole transport layer 132, a light-emitting layer 14, an electron transport layer 151, an electrode injection layer 152, a cathode 122, and a reflective layer 16 that are disposed to be sequentially laminated, wherein a material of the reflective layer 16 has a selective reflection function on light having different wavelengths. In FIG. 1, an arrow represents a light-emitting direction.

In particular, the white OLED device provided by the present embodiment is a three-primary color white light device. That is to say, the light-emitting layer thereof is constructed by RGB pixels. The white OLED device can emit ideal white light. More specifically, a pixel arrangement mode of the white OLED may be a standard RGB arrangement, a PenTile arrangement, a Diamond pixel arrangement, or other modes, which will not be repeated here. Those skilled in the art just make a technical selection by referring to the prior art according to the specific requirements of the device.

In the present embodiment, the pixel arrangement mode of the white OLED is specifically a standard RGB arrangement. Since a B pixel that emits a blue light have a low luminous efficiency, in order to match the B pixel, luminous efficiencies of R pixel that emits red light and G pixel that emits green light need to be artificially reduced. In order to avoid problems of mismatching of concentration of carriers in the device, and high heat of the device and accumulation of charges and heat caused by the R pixel and G pixel that use excess energy to generate heat, an Al film having a thickness of 1200 Å is selected as the reflective layer 16 in the present embodiment. As such, the reflective layer 16 may reflect the red light and the green light emitted by the R pixel and the G pixel, thereby changing a frequency spectrum of emitted spectrum to achieve a purpose of adjusting parameters, such as a chromaticity coordinate and the like, of the light-emitting device.

Accordingly, it can be seen that in the three-primary color white device of the present embodiment, the R pixel and the G pixel have higher specified luminous efficiencies than that of the B pixel. Thus, a material of the reflective layer 16 is required to have a selective reflection function on the red light and the green light emitted by the R pixel and the G pixel, i.e., having a selective reflection function on the light emitted by the materials having higher specified luminous efficiencies in the light-emitting layer 14.

In the present embodiment, material selections and size settings of the substrate 11, the anode 121, the hole injection layer 131, the hole transport layer 132, the light-emitting layer 14, the electron transport layer 151, the electrode injection layer 152, the cathode 122 will not be given unnecessary details here one by one. Those skilled in the art can refer to the prior art, for example, the substrate 11 may select a glass substrate, and the anode 121 may select ITO, and the like.

It is worth explaining that in the present embodiment, the cathode 122 is a thin layer cathode material which is almost transparent, and thus cannot reflect the red light and the green light emitted by the R pixel and the G pixel. However, if the thickness of the reflective layer 16 is thick enough and the material thereof belongs to a cathode material, the disposition of the cathode 122 can be omitted. The reflective layer 16 can perform functions of reflection and a cathode electrode simultaneously.

Embodiment 2

Figure 2:
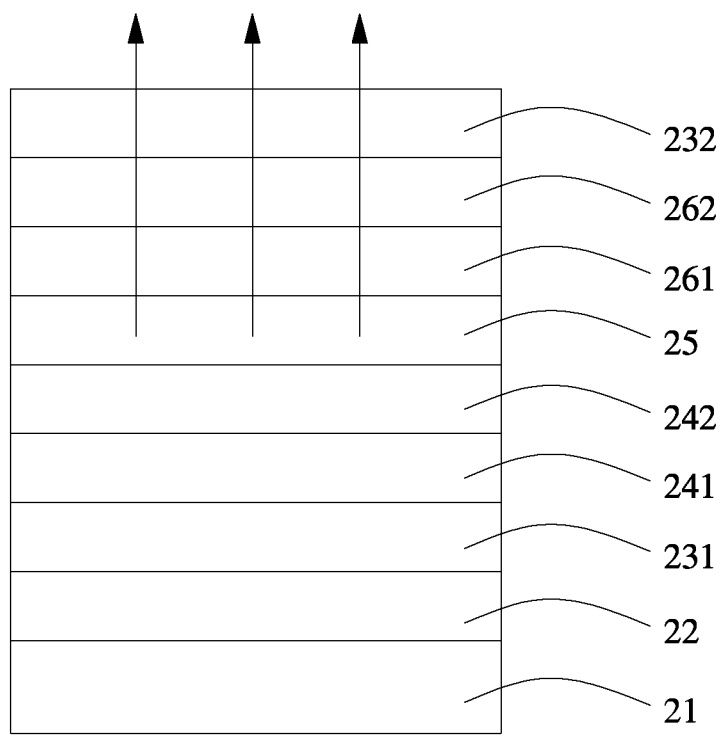
FIG. 2 is a structural schematic diagram of a top emitting white OLED device according to Embodiment 2 of the present disclosure.

The present embodiment provides a top light-emitting white OLED device. Referring to FIG. 2 for details, the white OLED device according to the present embodiment includes a substrate 21, a reflective layer 22, an anode 231, a hole injection layer 241, a hole transport layer 242, a light-emitting layer 25, an electron transport layer 261, an electrode injection layer 262, and a cathode 232 that are disposed to be sequentially laminated, wherein a material of the reflective layer 22 has a selective reflection function on light having different wavelengths. In FIG. 2, an arrow represents a light-emitting direction.

In particular, the white OLED device provided by the present embodiment is a B-Y stacked white device, that is to say, the light-emitting layer thereof is constructed by a blue light-emitting layer and a yellow light-emitting layer. The white OLED device can emit a warm lighting white light.

In the present embodiment, since the yellow light-emitting layer has a low luminous efficiency, in order to match the yellow light-emitting layer, a luminous efficiency of the blue light-emitting layer needs to be artificially reduced. In order to avoid problems of mismatching of concentration of carriers in the device, and high heat of the device and accumulation of charges and heat caused by the blue light-emitting layer that uses excess energy to generate heat, a composite film formed by an Al film having a thickness of 2000 Å and a $TiO_2$ film has a thickness of 500 Å is selected as the reflective layer 22 in the present embodiment. As such, the reflective layer 22 may reflect the blue light emitted by the blue light-emitting layer, thereby changing a frequency spectrum of an emitted spectrum, to achieve a purpose of adjusting parameters, such as a chromaticity coordinate and the like, of the light-emitting device.

Accordingly, it can be seen that in the B-Y stacked white device of the present embodiment, the blue light-emitting layer has a higher specified luminous efficiency than that of the yellow light-emitting layer. Thus, a material of the reflective layer 22 is required to have a selective reflection function on the blue light emitted by the blue light-emitting layer, i.e., having a selective reflection function on the light emitted by the materials having higher specified luminous efficiencies in the light-emitting layer 25.

In the present embodiment, material selections and size settings of the substrate 21, the anode 231, the hole injection layer 241, the hole transport layer 242, the light-emitting layer 25, the electron transport layer 261, the electrode injection layer 262, and the cathode 232 will not be given unnecessary details here one by one. Those skilled in the art can refer to the prior art, for example, the substrate 21 may select a glass substrate, and the anode 231 may select ITO, and the like.

According to the Embodiment 1 and the Embodiment 2 of the present disclosure, while manufacturing the top light-emitting OLED device, the reflective layer is disposed between the substrate and the anode, and while manufacturing a bottom light-emitting OLED device, the reflective layer is disposed on the cathode or the electron injection layer, which is a case where the reflective layer has functions of reflection and a cathode electrode. Meanwhile, the material of the reflective layer is required to have the selective reflection function on light having different wavelengths, especially on the light emitted by the material having a higher specified luminous efficiency in the light-emitting layer.

Certainly, the material of the reflective layer in the white OLED device according to the present disclosure is not limited to the statements in the Embodiment 1 and the Embodiment 2, which may be selected from the single layer film or the composite film formed by any one or at least two of Al, Ag, $SiO_2$, $SiN_x$, $TiO_x$, $GaO_x$ and α-Si; meanwhile, according to the material specifically selected, it is general to control the thickness within a range from 100 Å to 300 Å.

It is worth explaining that in the white OLED device of the present disclosure, the selection of the material of the reflective layer is most significant. For example, a Mg film, which is also a metal material as the Al film and Ag film are, is unavailable, this is because the Mg film does not have obvious selection on the reflection of the light having different wavelengths, that is, an adsorption of the Mg film for the light having a long wavelength and an adsorption of the Mg film for the light having a short wavelength do not have great difference.

Although the present disclosure is described with reference to the specific embodiments, it will be understand by those skilled in the art that various changes in form and details may be made therein without departing from the spirit and scope of the invention as defined by the appended claims and its equivalents.

What is claimed is:

1. A white organic light-emitting diode (OLED) device comprising:
   a substrate, an anode, a hole injection layer, a hole transport layer, a light-emitting layer, an electron transport layer, and an electron injection layer that are disposed to be sequentially laminated,
   wherein the white OLED device further comprises a reflective layer disposed on the electron injection layer,
   wherein a material of the reflective layer has a selective reflection function on light having different wavelengths,
   wherein the reflective layer is disposed on an opposite side of a light-emitting direction with respect to the light-emitting layer,
   wherein the white OLED device further comprises a cathode interposed between the electron injection layer and the reflective layer, and wherein the reflective layer is an Al film having a thickness of 1100Å to 1300Å.

2. The white OLED device of claim 1, wherein the material of the reflective layer has the selective reflection function on light emitted by a material having a higher specified luminous efficiency in the light-emitting layer.

3. The white OLED device of claim 1, wherein the white OLED device is a three-primary color white light device.

4. The white OLED device of claim 1, wherein the white OLED device is a B-Y stacked white light device.

5. A white organic light-emitting diode (OLED) device comprising:
   a substrate, an anode, a hole injection layer, a hole transport layer, a light-emitting layer, an electron transport layer, and an electron injection layer that are disposed to be sequentially laminated,
   wherein the white OLED device further comprises a reflective layer disposed on the electron injection layer,
   wherein a material of the reflective layer has a selective reflection function on light having different wavelengths,
   wherein the reflective layer is disposed on an opposite side of a light-emitting direction with respect to the light-emitting layer,
   wherein the white OLED device further comprises a cathode interposed between the electron injection layer and the reflective layer, and
   wherein the reflective layer is an Al:$TiO_2$ composite film having thicknesses of 1900 Å to 2100 Å and 400 Å to 600 Å, respectively.

6. The white OLED device of claim 2, wherein the white OLED device is a three-primary color white light device.

7. The white OLED device of claim 6, wherein the white OLED device is a B-Y stacked white light device.

* * * * *